(12) United States Patent
Cui et al.

(10) Patent No.: US 9,627,645 B2
(45) Date of Patent: Apr. 18, 2017

(54) MASK PLATE, ORGANIC LIGHT-EMITTING DIODE (OLED) TRANSPARENT DISPLAY PANEL AND MANUFACTURING METHOD THEREOF

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Ziwei Cui, Beijing (CN); Hao Wu, Beijing (CN); Hongyan Xing, Beijing (CN); Jing Xue, Beijing (CN); Yanyan Yin, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 121 days.

(21) Appl. No.: 14/347,079

(22) PCT Filed: Jun. 21, 2013

(86) PCT No.: PCT/CN2013/077679
§ 371 (c)(1),
(2) Date: Mar. 25, 2014

(87) PCT Pub. No.: WO2014/146364
PCT Pub. Date: Sep. 25, 2014

(65) Prior Publication Data
US 2015/0303399 A1 Oct. 22, 2015

(30) Foreign Application Priority Data

Mar. 20, 2013 (CN) .......................... 2013 1 0089407
Jun. 18, 2013 (CN) .......................... 2013 1 0241839

(51) Int. Cl.
*H01L 51/52* (2006.01)
*H01L 51/00* (2006.01)
*H01L 27/32* (2006.01)

(52) U.S. Cl.
CPC .......... *H01L 51/5225* (2013.01); *H01L 27/32* (2013.01); *H01L 51/0011* (2013.01);
(Continued)

(58) Field of Classification Search
CPC ............. H01L 2251/5323; H01L 27/32; H01L 27/3218; H01L 51/0011; H01L 51/0023; H01L 51/5225; H01L 51/5234
(Continued)

(56) References Cited

U.S. PATENT DOCUMENTS

2001/0026123 A1  10/2001  Yoneda
2008/0136317 A1*  6/2008  Rogojevic ............. H01L 25/048
                                                               313/504
(Continued)

FOREIGN PATENT DOCUMENTS

CN    101013173 A    8/2007
CN    101442042 A    5/2009
(Continued)

OTHER PUBLICATIONS

Written Opinion of the International Searching Authority dated Dec. 11, 2013; PCT/CN2013/077679.
First Chinese Office Action dated Apr. 3, 2015; Appln. No. 201310241839.X.

*Primary Examiner* — Mamadou Diallo
(74) *Attorney, Agent, or Firm* — Ladas & Parry LLP

(57) ABSTRACT

A mask plate for manufacturing an organic light-emitting diode (OLED) transparent display panel, the OLED transparent display panel and a manufacturing method thereof are disclosed. The mask plate includes a substrate and a plurality of hollowed-out areas and a plurality of opaque areas (Continued)

disposed on the substrate, and a pattern of the hollowed-out areas correspond to a pattern of a cathode of the OLED transparent display panel to be manufactured; and all the hollowed-out areas are communicated with each other.

19 Claims, 3 Drawing Sheets

(52) U.S. Cl.
CPC ...... *H01L 51/0023* (2013.01); *H01L 27/3218* (2013.01); *H01L 51/5234* (2013.01); *H01L 2251/5323* (2013.01)

(58) Field of Classification Search
USPC ............ 257/13, 79–103, 918; 438/28–29, 34
See application file for complete search history.

(56) References Cited

U.S. PATENT DOCUMENTS

| | | | |
|---|---|---|---|
| 2008/0246027 | A1* | 10/2008 | Kim .................... H01L 27/3211 257/40 |
| 2012/0286651 | A1* | 11/2012 | Levermore ............ H05B 33/10 313/504 |
| 2013/0037827 | A1* | 2/2013 | Levermore ......... H01L 27/3202 257/88 |

FOREIGN PATENT DOCUMENTS

| | | |
|---|---|---|
| CN | 102456710 A | 5/2012 |
| CN | 102899609 A | 1/2013 |
| CN | 203456462 U | 2/2014 |

* cited by examiner

MASK PLATE, ORGANIC LIGHT-EMITTING DIODE (OLED) TRANSPARENT DISPLAY PANEL AND MANUFACTURING METHOD THEREOF

TECHNICAL FIELD

Embodiments of the present invention relate to a mask plate, an organic light-emitting diode (OLED) transparent display panel and a manufacturing method thereof.

BACKGROUND

OLEDs belong to a new kind of application technology suitable to the next-generation flat panel displays because it has the advantages such as self-luminescence, no need of backlights, high contrast, small thickness, wide viewing angle, rapid response speed, capability of being applied to flexible panels, wide service temperature range, simple structure and manufacturing process, and the like.

The conduction of all the cathodes in a traditional OLED transparent display panel has to be achieved by the deposition process for two times. FIG. 1 illustrates a mask plate adopted in a traditional method for manufacturing the cathodes of an OLED transparent display panel. In the mask plate, reversed "T"-shaped regions 101 are hollowed-out areas and are region for depositing a cathode material of the OLED. After the first deposition for the cathodes is conducted with the mask plate, the mask plate must be translated for a default offset; and then the second deposition for the cathodes is conducted to form the cathode pattern as shown in FIG. 2. The cathodes must be communicated with each other.

However, as seen from the cathode layout of the traditional OLED transparent display panel, in the manufacturing process, the communication of the cathodes has to be achieved by the deposition process for two times (the communication of various cathodes can only be achieved by mutual overlap). Therefore, the process is relatively complex; the costs are relatively high; and the area occupied by the cathodes is relatively large, and hence the aperture ratio is relatively small and the transmittance is relatively low.

SUMMARY

Embodiments of the present invention provide a mask plate for manufacturing an OLED transparent display panel, an OLED transparent display panel and a manufacturing method thereof, which can reduce the manufacturing time of a cathode and hence reduce the cost.

An embodiment of the present invention provides a mask plate for manufacturing an OLED transparent display panel, which comprises a substrate and a plurality of hollowed-out areas and a plurality of opaque areas disposed on the substrate. A pattern of the hollowed-out areas corresponds to a pattern of a cathode of the OLED transparent display panel to be manufactured. All the hollowed-out areas are communicated with each other.

For instance, the hollowed-out areas may be of a shape of triangular, rhombus, circle disk or rectangular.

Another embodiment of the present invention provides an OLED transparent display panel, which comprises: a substrate and a cathode disposed on the substrate. The cathode includes a plurality of mutually communicated cathode units, and is manufactured by any foregoing mask plate.

For instance, the cathode units may be of a shape of triangular, rhombus, circle disk or rectangular.

For instance, the OLED transparent display panel may further comprise: a first transport layer, a light-emitting layer, a second transport layer and an anode disposed on the substrate.

For instance, the first transport layer or the second transport layer may be in a multi-layer structure formed by laminate of a barrier layer, an injection layer and a transport layer.

For instance, the material of the light-emitting layer may be a single organic substance or a doped organic substance.

For instance, the doped organic substance may be a fluorescent material or a phosphorescent material.

Still another embodiment of the present invention provides a method for manufacturing the OLED transparent display panel, which comprises: forming a cathode on a substrate by one patterning process. The cathode includes a plurality of mutually communicated cathode units.

For instance, forming the cathode on the substrate by one patterning process may further include: forming a cathode film on the substrate; forming a photoresist on the cathode film; exposing and developing the photoresist to form a photoresist-retained region and a photoresist-removed region, in which the photoresist-retained region corresponds to the cathode; and etching the cathode film corresponding to the photoresist-removed region so as to form the cathode.

For instance, the method for manufacturing the OLED transparent display panel may further comprise: forming a first transport layer, a light-emitting layer, a second transport layer and an anode on the substrate.

For instance, the process of forming the first transport layer, the light-emitting layer, the second transport layer and the anode on the substrate may further include: forming the anode on the substrate; forming the first transport layer on the substrate obtained after the above process is completed; forming the light-emitting layer on the substrate obtained after the above processes are completed; and forming the second transport layer on the substrate obtained after the above processes are completed.

Still another embodiment of the present invention provides a method for manufacturing the OLED transparent display panel. The OLED transparent display panel comprises a cathode. The cathode is formed by any foregoing mask plate, and is formed by one evaporation process. The hollowed-out areas correspond to cathode areas.

For instance, the method for manufacturing the OLED transparent display panel may further comprise: forming a first transport layer, a light-emitting layer, a second transport layer and an anode on a substrate.

For instance, forming the first transport layer, the light-emitting layer, the second transport layer and the anode on the substrate may further include: forming the anode on the substrate; forming the first transport layer on the substrate obtained after the above process is completed; forming the light-emitting layer on the substrate obtained after the above processes are completed; and forming the second transport layer on the substrate obtained after the above processes are completed.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise defined, the technical terms or scientific terms used herein have normal meanings understood by those skilled in the art. The words "first", "second" and the like used in the description and the claims of the patent application of the present invention do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "under", "left", "right" and the like only indicate the relative position relationship which is correspondingly changed when the absolute position of a described object is changed.

Figure 1:
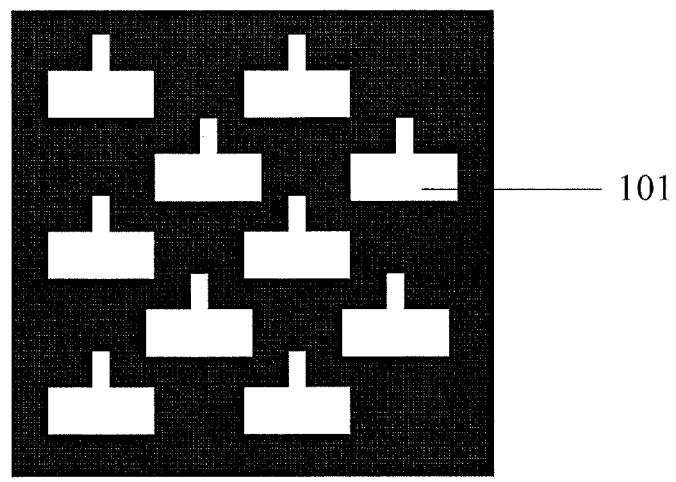
FIG. 1 is a schematic top view 1 illustrating the layout of a traditional mask plate.
Figure 2:
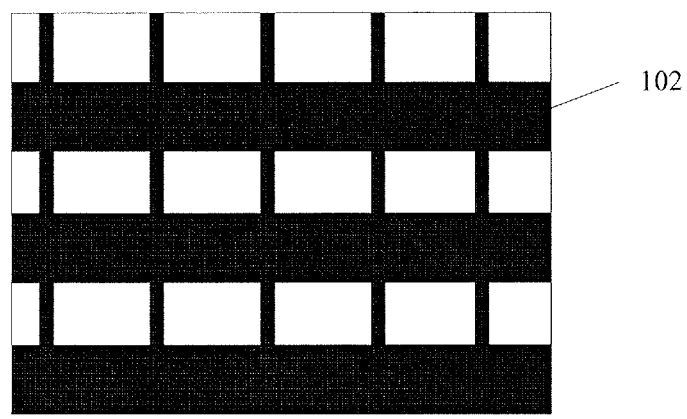
FIG. 2 is a schematic top view illustrating the layout of the cathodes of the traditional display panel.
Figure 3:
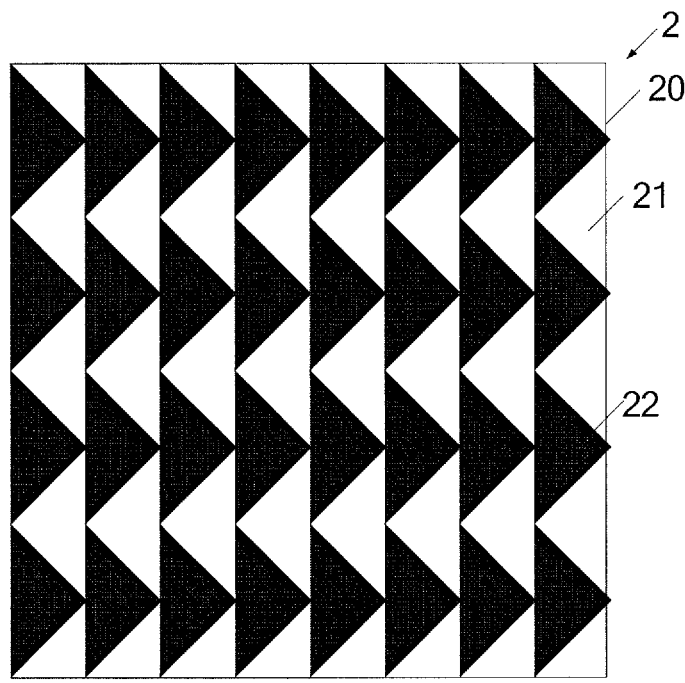
FIG. 3 is a schematic top view illustrating the layout of a mask plate provided in an embodiment of the present invention.

As illustrated in FIG. 3, one embodiment of the present invention provides a mask plate 2 for manufacturing an OLED transparent display panel. The mask plate 2 comprises a substrate 20 and a plurality of hollowed-out areas 21 and a plurality of opaque areas 22 disposed on the substrate 20. The hollowed-out areas 22 correspond to cathodes of the OLED transparent display panel to be manufactured. All the hollowed-out areas 22 are communicated with each other.

Moreover, the hollowed-out area may adopt various appropriate shapes, for instance, may be of a shape of triangular, rhombus, circle disk or rectangular. The opaque areas may be directly connected with each other at end portions thereof as shown in FIG. 3 or may be connected with each other through connecting electrodes.

These opaque areas are, for instance, obtained by first depositing a film made of, for instance, metal chromium (Cr) or an oxide thereof, on the substrate 20, and then performing a photolithography process thereon.

The mask plate provided by the embodiment comprises a substrate and a plurality of hollowed-out areas and a plurality of opaque areas disposed on the substrate. The hollowed-out areas correspond to cathodes of the OLED transparent display panel to be manufactured, and all the hollowed-out areas are communicated with each other. With the mask plate, the cathodes of the OLED transparent display panel may be formed by one patterning process or one evaporation process. The formed cathodes include a plurality of mutually communicated cathode units. Therefore, compared with the traditional method, the manufacturing method employing the mask plate reduces the number of the processes for the manufacturing the cathodes, reduces the time for manufacturing the cathodes, and reduces the costs. Moreover, the area occupied by the manufactured cathodes is relatively small, and hence the aperture ratio and the transmittance can be improved.

Another embodiment of the present invention provides an OLED transparent display panel, which comprises: a substrate and a cathode disposed on the substrate. The cathode includes a plurality of cathode units that are mutually communicated (conducted with each other), and is manufactured by use of any foregoing mask plate. Corresponding to the mask plate as shown in FIG. 3, the cathode units may be of a shape of triangular and are connected with each other.

Figure 4:
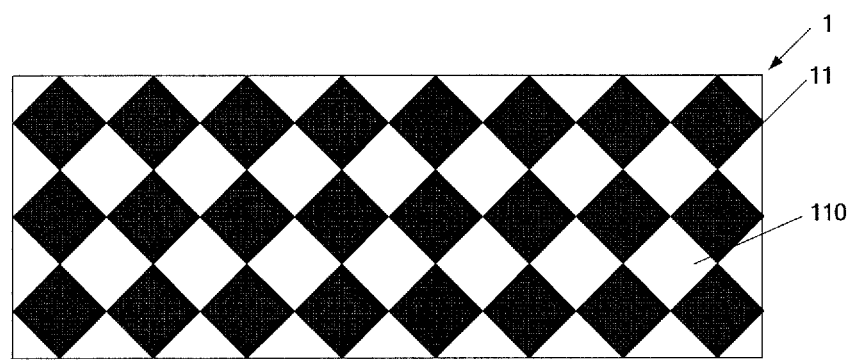
FIG. 4 is a schematic top view 1 illustrating the layout of a cathode of a display panel provided in an embodiment of the present invention.
Figure 5:
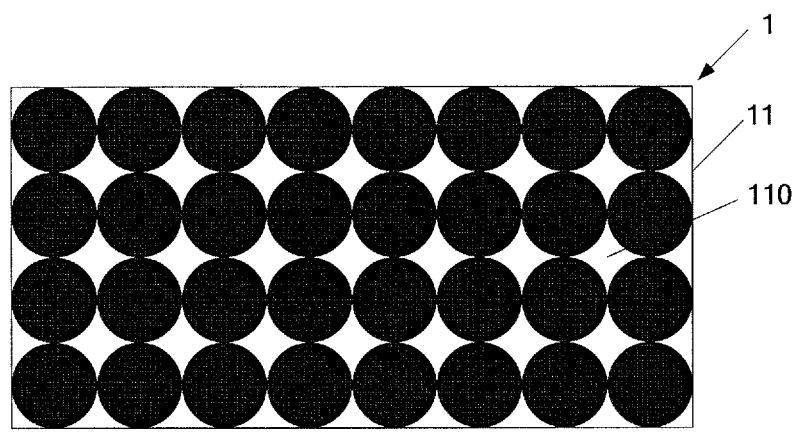
FIG. 5 is a schematic top view 2 illustrating the layout of the cathode of the display panel provided in an embodiment of the present invention.

As illustrated in FIGS. 4 and 5, as the hollowed-out areas of the mask plate provided by the embodiment may also be of a shape of rhombus, circle disk or in other shapes (for instance, rectangular), the cathode units 110 of a cathode 11 of a display panel manufactured with the mask plate may also be of a shape of triangular, rhombus, circle disk, rectangular or the like.

It should be noted that: as seen from the pattern, where the area of the cathode is larger, the transmittance of the display panel is lower; therefore, if the cathode units are of a shape of circle disk, the transparent display effect of the display panel is poor compared with the case that the cathode units are of a shape of triangular, rhombus or rectangular. With the cathodes of a shape of triangular, rhombus or rectangular, the transmittance can be up to 50 percent, so that the transparency is better and the transmittance is all superior to that of the display panel in the prior art. However, if the cathode is required to be combined with a traditional color filter, the rectangular design may be preferably adopted. If the areas in the mask plate can correspond to all the cathode units in the embodiment and the transmissive windows of various pixel units, the objective of improving the transmittance of the display panel can be better achieved.

In addition, the cathode units in the embodiment may also adopt other shapes except circle disk (the shape is mainly varied according to the variation of the layout of the mask plate). In this case, the transmittance of the display panel can be greatly improved. However, in view of the traditional process and the traditional material, when the area of the cathode is reduced, the drive capability of the display panel is reduced accordingly, and accordingly as for the display of the display panel, the phenomena of low contrast, abnormal color and the like may occur. If both the material for forming the cathode and the characteristics of the display panel can be improved in the future, namely the cathode with a small area is quite capable of achieving normal driving, adoption of the shape except circle disk may also be good choices for improving the transmittance of the display panel.

Moreover, the display panel provided by the embodiment of the present invention may further comprise a first transport layer, a light-emitting layer, a second transport layer, and an anode that are disposed on the substrate.

Figure 6:
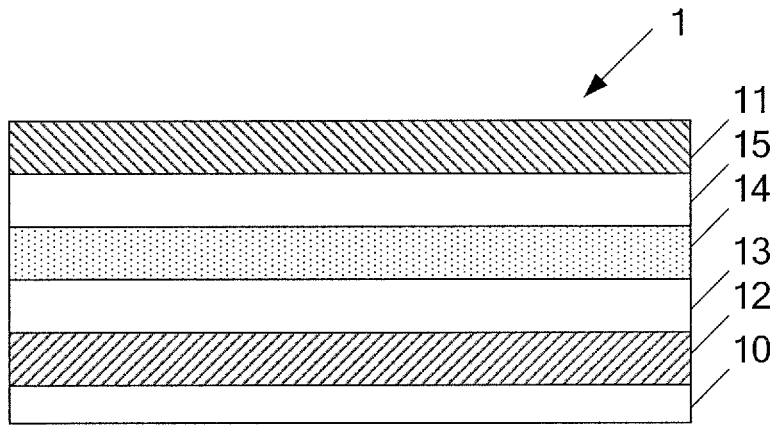
FIG. 6 is a schematic structural view of the display panel provided in an embodiment of the present invention.

In an embodiment of the display panel of the present invention, as illustrated in FIG. 6, the display panel 1 provided by the embodiment of the present invention may comprise: a substrate 10, an anode 12 disposed on the substrate 10, a first transport layer 13 disposed on the anode 12, a light-emitting layer 14 disposed on the first transport layer 13, a second transport layer 15 disposed on the light-emitting layer 14, and a cathode 11 disposed on the second transport layer 15. The cathode 11 includes a plurality of mutually communicated cathode units, and is manufactured with the mask plate provided by any foregoing embodiment.

The light-emitting layer may be various available light-emitting layers, for instance, may emit red light, green light, blue light, white light or the like.

For instance, the first transport layer may be a hole transport layer, and the second transport layer may also be an electron transport layer. In the embodiment of the present invention, where an appropriate bias voltage is applied between the cathode and the anode, electrons and holes are injected from the cathode and the anode respectively. As the migration rate of the holes in organic layers is higher than that of the electrons, the holes and the electrons are recombined on an interface of the light-emitting layer, close to the cathode, and then the display panel can emit light.

It should be noted that the display panel provided by one embodiment of the present invention may be a top-emission OLED transparent display panel and the display panel provided by another embodiment of the present invention may be a bottom-emission OLED transparent display panel. In the embodiment, the cathode may be disposed between the substrate and the first transport layer, and the anode may be disposed on the second transport layer. The structure of the cathode is the same as that of the above embodiment, and hence should also fall within the scope of protection of the present invention.

Moreover, the first transport layer or the second transport layer may also be a multi-layer structure formed by laminate of a barrier layer, an injection layer and a transport layer.

Moreover, the material of the light-emitting layer may be a simple organic substance or a doped organic substance.

Furthermore, the doped organic substance may be a fluorescent material or a phosphorescent material.

The display panel provided by the embodiment of the present invention comprises a substrate and a cathode disposed on the substrate. The cathode includes a plurality of mutually communicated cathode units. As the cathode may be formed by one patterning process or one evaporation process and the formed cathode includes a plurality of mutually communicated cathode units, compared with the traditional method, the number of the processes for manufacturing the cathode is reduced; the time for manufacturing the cathode is reduced; and hence the costs are reduced. Moreover, the area occupied by the cathode is relatively small, and hence the aperture ratio and the transmittance can be improved.

Another embodiment of the present invention provides a method for manufacturing an OLED transparent display panel, which comprises: forming a cathode on a substrate by one patterning process, in which the cathode includes a plurality of mutually communicated cathode units.

The patterning process herein refers to the photolithography patterning process and includes: coating photoresist on a structure layer to be patterned; exposing the photoresist with a mask plate; developing the exposed photoresist to obtain a photoresist mask; etching the structure layer to form a pattern with the obtained photoresist mask as an etching mask; and removing the photoresist mask. Positive photoresist is, for instance, applied. In one patterning process, as for the all the photoresist coated on the structure layer to be patterned, the way of exposing a part of the area with the mask plate each time to expose all the photoresist step by step may be adopted. After the process of development, the whole structure layer is subjected to a same etching process to form a required pattern.

An embodiment of the present invention provides a method for manufacturing an OLED transparent display panel. The method comprises the following steps:

S101: selecting a substrate.

A glass plate, a quartz plate, a silicon wafer, a metal plate, polyethylene terephthalate (PET) or a flexible polymer film subjected to a surface treatment may be selected as the substrate.

S102: forming an anode on the substrate.

The anode of an OLED is usually made of a material such as indium tin oxide (ITO), indium zinc oxide (IZO) and aluminum-doped zinc oxide (Al-doped ZnO or AZO).

S103: forming a first transport layer on the substrate, on which the anode is formed, by chemical vapor deposition (CVD), physical vapor deposition (PVD) or spin coating.

The first transport layer is a hole transport layer. The hole transport layer may be made of triarylamine which comprises biphenyl as a core, for instance, N,N-bis(naphthalen-1-y)-N,N'-bis(phenyl)benzidine(NPB) and benzidine. The thickness of the first transport layer is usually ranged from 10 to 50 nm.

S104: forming a light-emitting layer on the substrate, on which the first transport layer is formed, by evaporation, spin coating or ink-jet printing.

The light-emitting layer may be made of a single organic substance such as aluminium tris(quinolin-8-olate) (Alq3), rubrene or the like. The organic substance may also contain a dopant. For instance, rubrene is doped into 4,4'-bis(N-carbazolyl)-1,1'-biphenyl (CBP). The organic substance may also be a phosphorescent material such as fac-tris(2-phenylpyridine)iridium[Ir(ppy)3] or a fluorescent material. The thickness of the light-emitting layer is usually ranged from 1 to 50 nm.

Where each pixel of the manufactured OLED display panel is, for instance, composed of a red sub-pixel, a green sub-pixel and a blue sub-pixel, the mask plate can be used for performing the deposition process. For instance, the material of a red light-emitting layer, the material of a green light-emitting layer and the material of a blue light-emitting layer are formed on the substrate in sequence by deposition.

S105: forming a second transport layer on the substrate, on which the light-emitting layer is formed, by CVD, PVD or spin coating.

In the embodiment of the present invention, the second transport layer formed in the step 105 may be an electron transport layer. For instance, the electron transport layer may be made of a material such as Alq3,2,2',2"-(1,3,5-benzenetriyetris[1-phenyl-1H-benzimidazole](TPBI), 4,7-diphenyl-1 and 10-phenanthroline(Bphen) doped with metal cesium (Cs), or the like. The thickness of the second transport layer is usually ranged from 10 to 100 nm.

S106: forming a cathode on the substrate, on which the second transport layer is formed, by one patterning process, in which the cathode includes a plurality of mutually communicated cathode units.

As described below, a specific example of the step S106 further includes the following substeps S106a to S106d:

S106a: forming a cathode film on the substrate.

S106b: forming photoresist on the cathode film.

S106c: exposing and developing the photoresist, and forming a photoresist-retained region and a photoresist-removed region, in which the photoresist-retained region corresponds to the cathode.

For instance, the photoresist is exposed with the mask plate provided in the above embodiment, and hence the photoresist-retained region and the photoresist-removed region are formed after development; and the photoresist-retained region corresponds to the cathode.

In the step, a negative photoresist is adopted in the exposure process. After the exposure process, the hollowed-out areas of the mask plate correspond to the photoresist-retained region, and the opaque areas correspond to the photoresist-removed region.

S106d: etching the cathode film corresponding to the photoresist-removed region to form the cathode. The etching process adopted here, for instance, may be a dry etching process and may also be a wet etching process.

In order to effectively inject electrons into an organic material, the work function of the cathode material must be as low as possible, and furthermore an OLED device provided with a cathode made of a metal of low work function has a faster response speed. Currently, single-layered metal cathodes applied in an OLED device include Mg (3.7 eV), Li (2.9 eV), Ca (2.9 eV), Sr (2.4 eV), Na (2.3 eV), Cs (2.1 eV), Gd and the like. In order to prevent water and oxygen from adversely affecting the metal cathodes of low work function, alloy cathodes such as Ca/Al, Mg/Ag, Mg/MgAg, Gd/Al, Al/Li, Sn/Al and Ag/Al may also be adopted. The cathode of an OLED in the embodiment may be magnesium-aluminum (Mg/Al) alloy, magnesium-silver (Mg—Ag) alloy, calcium-silver (Ca/Ag) alloy or the like, and the thickness of the cathode is usually ranged from 10 to 200 nm.

Where poor communication occurs between the manufactured cathode units, the cathode units with poor communication therebetween can be connected with other normal cathode units by a point connection method, so that the normal operation of the display panel on the whole can be guaranteed.

Here, the display panel as shown in FIG. 6 is completely manufactured.

Finally, the whole display device may be encapsulated by a seal cover or a thin-film encapsulation layer to prevent water and oxygen from eroding the organic layers.

Another embodiment of the present invention further provides another method for manufacturing a display panel. The difference of the manufacturing method from the above manufacturing method lies in that:

In the step S106, the cathode may also be formed by one evaporation process as long as the above mask plate is adopted in the evaporation process. A plurality of hollowed-out areas correspond to a plurality of cathode units of the OLED panel, and meanwhile the plurality of hollowed-out areas are communicated with each other. Therefore, various cathode units on the substrate, after evaporation, are also communicated with each other to form an integrally connected cathode.

The selection of cathode material may also be conducted as described above.

Finally, the whole display device may be encapsulated by a seal cover or a thin-film encapsulation layer to prevent water and oxygen from eroding organic layers.

In the method for manufacturing the display panel provided by the embodiment of the present invention, the cathode is formed on the substrate by one patterning process and includes a plurality of mutually communicated cathode units. As the cathode is formed by one patterning process or one evaporation process and the formed cathode includes a plurality of mutually communicated cathode units, compared with the conventional technology, the number of the processes for the manufacturing the cathodes is reduced; the time for manufacturing the cathodes is reduced; and hence the costs are reduced.

In the embodiment of the present invention, after an appropriate bias voltage is applied between the cathode and the anode, electrons and holes are injected from the cathode and the anode respectively. As the migration rate of the holes in the organic layers is higher than that of the electrons, the holes and the electrons are usually recombined on an interface of the light-emitting layer, close to the cathode, and hence the display panel can emit light. The method for manufacturing the display panel provided by the present invention can achieve the single-process forming of the cathode and can still achieve the communication of the cathode while reducing the area of the cathode. The method greatly reduces the manufacturing costs of the cathodes of an OLED. Moreover, due to the single-process non-overlap deposition process, the cathode is more flattened, and hence the communication effect can be better achieved.

The foregoing is only the preferred embodiments of the present invention and not intended to limit the scope of protection of the present invention. The scope of protection of the present invention should be defined by the appended claims.

The invention claimed is:

1. A mask plate for manufacturing an organic light-emitting diode (OLED) transparent display panel, comprising a substrate and a plurality of hollowed-out areas and a plurality of opaque areas disposed on the substrate,
wherein a pattern of the hollowed-out areas corresponds to a pattern of a cathode of the OLED transparent display panel to be manufactured; adjacent hollowed-out areas are in contact with each other, adjacent opaque areas are in contact with each other, and all the hollowed-out areas and opaque areas cover the entire substrate.

2. The mask plate according to claim 1, wherein the hollowed-out areas are of a shape of triangular, rhombus, circle disk or rectangular.

3. An organic light-emitting diode (OLED) transparent display panel, comprising:
a substrate; and
a cathode disposed on the substrate, in which the cathode includes a plurality of mutually communicated cathode units and is manufactured with the mask plate according to claim 1.

4. The OLED transparent display panel according to claim 3, wherein the cathode units are of a shape of triangular, rhombus, circle disk or rectangular.

5. The OLED transparent display panel according to claim 3, wherein the OLED transparent display panel further comprises:
a first transport layer, a light-emitting layer, a second transport layer and an anode disposed on the substrate.

6. The OLED transparent display panel according to claim 5, wherein the first transport layer or the second transport layer is in a multi-layer structure formed by laminate of a barrier layer, an injection layer and a transport layer.

7. The OLED transparent display panel according to claim 6, wherein a material of the light-emitting layer is a single organic substance or a doped organic substance.

8. The OLED transparent display panel according to claim 7, wherein the doped organic substance is a fluorescent material or a phosphorescent material.

9. A method for manufacturing an OLED transparent display panel, comprising:
   forming a cathode on a substrate using the mask plate of claim 1 by one patterning process, in which the cathode includes a plurality of mutually communicated cathode units.

10. The method for manufacturing an OLED transparent display panel according to claim 9, wherein forming the cathode on the substrate by one patterning process includes:
   forming a cathode film on the substrate;
   forming photoresist on the cathode film;
   exposing and developing the photoresist using the mask plate of claim 1, and forming a photoresist-retained region and a photoresist-removed region, in which the photoresist-retained region corresponds to the cathode; and
   etching the cathode film corresponding to the photoresist-removed region to form the cathode.

11. The method for manufacturing the OLED transparent display panel according to claim 9, further comprising:
   forming a first transport layer, a light-emitting layer, a second transport layer and an anode on the substrate.

12. The method for manufacturing the OLED transparent display panel according to claim 11, wherein forming the first transport layer, the light-emitting layer, the second transport layer and the anode on the substrate includes:
   forming the anode on the substrate;
   forming the first transport layer on the substrate obtained after the above process is completed;
   forming the light-emitting layer on the substrate obtained after the above processes are completed; and
   forming the second transport layer on the substrate obtained after the above processes are completed.

13. A method for manufacturing an OLED transparent display panel, wherein the OLED transparent display panel comprises a cathode; the cathode is formed by the mask plate according to claim 1 and is formed by one evaporation process; and hollowed-out areas correspond to the cathodes of the OLED transparent display panel.

14. The method for manufacturing the OLEO transparent display panel according to claim 13, further comprising:
   forming a first transport layer, a light-emitting layer, a second transport layer and an anode on the substrate.

15. The method for manufacturing the OLED transparent display panel according to claim 14, wherein forming the first transport layer, the light-emitting layer, the second transport layer and the anode on the substrate includes:
   forming the anode on the substrate;
   forming the first transport layer on the substrate obtained after the above process is completed;
   forming the light-emitting layer on the substrate obtained after the above processes are completed; and
   forming the second transport layer on the substrate obtained after the above processes are completed.

16. The OLED transparent display panel according to claim 4, wherein the OLED transparent display panel further comprises:
   a first transport layer, a light-emitting layer, a second transport layer and an anode disposed on the substrate.

17. The OLED transparent display panel according to claim 16, wherein the first transport layer or the second transport layer is in a multi-layer structure formed by laminate of a barrier layer, an injection layer and a transport layer.

18. The OLED transparent display panel according to claim 17, wherein a material of the light-emitting layer is a single organic substance or a doped organic substance.

19. The OLED transparent display panel according to claim 18, wherein the doped organic substance is a fluorescent material or a phosphorescent material.

* * * * *